(12) United States Patent
Yun et al.

(10) Patent No.: US 10,910,446 B2
(45) Date of Patent: Feb. 2, 2021

(54) DISPLAY DEVICE FOR DISPLAYING THE OUTLINE OF ICONS

(71) Applicant: Samsung Display Co., Ltd., Yongin-si (KR)

(72) Inventors: Young Nam Yun, Suwon-si (KR); Kyu Seok Kim, Yongin-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 0 days.

(21) Appl. No.: 15/092,357

(22) Filed: Apr. 6, 2016

(65) Prior Publication Data

US 2016/0293672 A1 Oct. 6, 2016

(30) Foreign Application Priority Data

Apr. 6, 2015 (KR) ........................ 10-2015-0048278

(51) Int. Cl.
*H01L 27/32* (2006.01)
*H01L 51/52* (2006.01)

(52) U.S. Cl.
CPC .......... *H01L 27/322* (2013.01); *H01L 27/326* (2013.01); *H01L 51/5271* (2013.01); *H01L 27/323* (2013.01); *H01L 2251/5315* (2013.01)

(58) Field of Classification Search
CPC ...... G06F 3/044; G06F 3/0412; G06F 1/1643; G06F 1/1652; G06F 1/169; G06F 2203/04102
USPC ....................................................... 345/694
See application file for complete search history.

(56) References Cited

U.S. PATENT DOCUMENTS

| 7,646,455 | B2 * | 1/2010 | Rho | G02F 1/133555 349/106 |
| 8,009,125 | B2 * | 8/2011 | Kim | G09G 3/3233 315/169.3 |
| 9,876,056 | B2 * | 1/2018 | Seo | H01L 51/0054 |
| 2005/0253799 | A1 * | 11/2005 | Kamio | G09G 3/3614 345/103 |
| 2006/0082714 | A1 * | 4/2006 | Chae | G02F 1/136204 349/149 |
| 2007/0008421 | A1 * | 1/2007 | Wu | H01L 27/14627 348/340 |
| 2009/0322702 | A1 * | 12/2009 | Chien | G06F 3/0412 345/174 |
| 2011/0175883 | A1 * | 7/2011 | Toyotaka | G09G 3/3648 345/211 |
| 2013/0307816 | A1 * | 11/2013 | Lee | G06F 1/1652 345/174 |

(Continued)

FOREIGN PATENT DOCUMENTS

| KR | 10-0787458 B1 | 12/2007 |
| KR | 10-2008-0066282 A | 7/2008 |

(Continued)

*Primary Examiner* — Yuzhen Shen
(74) *Attorney, Agent, or Firm* — F. Chau & Associates, LLC

(57) ABSTRACT

A display device is disclosed. In one aspect, the display device includes a substrate and a plurality of first pixels and a plurality of second pixels formed on the substrate. Each of the first pixels includes a first reflective layer and a first emission layer and is configured to reflect external light so as to display the outline of an icon. Each of the second pixels includes a second reflective layer, a second emission layer, and a color filter.

20 Claims, 11 Drawing Sheets

(56) References Cited

U.S. PATENT DOCUMENTS

| | | | | |
|---|---|---|---|---|
| 2014/0152707 | A1* | 6/2014 | Numata | G09G 3/3233 345/690 |
| 2014/0300533 | A1* | 10/2014 | Cho | G06F 3/041 345/156 |
| 2015/0162392 | A1* | 6/2015 | Lim | H01L 27/3244 257/72 |
| 2015/0280161 | A1* | 10/2015 | Song | H01L 51/504 257/40 |
| 2015/0331508 | A1* | 11/2015 | Nho | G06F 3/0421 345/173 |
| 2016/0260785 | A1* | 9/2016 | Jiao | H01L 27/3246 |
| 2018/0024722 | A1* | 1/2018 | Lee | G06F 3/04817 |

FOREIGN PATENT DOCUMENTS

| | | |
|---|---|---|
| KR | 10-2013-0053655 A | 5/2013 |
| KR | 10-2013-0081617 A | 7/2013 |
| KR | 10-2014-0089313 A | 7/2014 |

\* cited by examiner

DISPLAY DEVICE FOR DISPLAYING THE OUTLINE OF ICONS

RELATED APPLICATIONS

This application claims priority to and the benefit of Korean Patent Application No. 10-2015-0048278 filed in the Korean Intellectual Property Office on Apr. 6, 2015, the entire contents of which are incorporated herein by reference.

BACKGROUND

Field

The described technology generally relates to a display device.

Description of the Related Technology

An organic light-emitting diode display typically includes a polarizing film formed of a linear polarizer and a ¼ wavelength plate. The polarization film serves to increase outdoor visibility by suppressing reflection of ambient light. However, since a part of the light emitted from a pixel (in addition to the ambient light) is blocked by the linear polarizer, light efficiency degrades. Further, since the polarization film tends to be thick, it is more difficult to manufacture a thin display device.

Color filters typically include a red filter, a green filter, and a blue filter and absorb remaining color components to reduce the reflection of external light. Since the color filter has a high light efficiency and is thinner in comparison to the polarization film, a display device with a slim profile can be achieved.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect relates to a display device including a color filter.

Another aspect is a display device for displaying the outline of icons in both a driving state and a non-driving state and more improving outdoor visibility.

Another aspect is a display device including a substrate, and a plurality of first pixels and a plurality of second pixels which are formed on the substrate. Each of the first pixels includes a first reflective layer and a first emission layer and reflects external light to display the outline of an icon. Each of the second pixels includes a second reflective layer, a second emission layer, and a color filter.

The first reflective layer and the second reflective layer may serve as a pixel electrode, and a common electrode may be formed in all of the first pixels and the second pixels. A thin film encapsulation may be formed on the common electrode, and the color filter may be formed on the thin film encapsulation.

The first pixels and the second pixels may configure a main display unit and an auxiliary display unit, and the first pixels may be formed by an icon shape in at least one of the main display unit and the auxiliary display unit.

The auxiliary display unit may be connected to one side of the main display unit and curved with a single curvature. The main display unit and the auxiliary display unit may be controlled to be separately driven, and information may be displayed by driving the auxiliary display unit in a state where the main display unit is turned off.

The main display unit may include a plurality of first color filters, and the auxiliary display unit may include a plurality of second color filters. The second color filters may be formed with a thickness larger than that of the first color filters.

The second color filters may include a red filter, a green filter, and a blue filter, and the red filter and the green filter may be formed with a thickness larger than that of the blue filter. The thickness of the second color filters may be gradually increased further from the main display unit.

Another aspect is a display device, comprising: a substrate; and a plurality of first pixels and a plurality of second pixels formed on the substrate, wherein each of the first pixels includes a first reflective layer and a first emission layer and is configured to reflect external light so as to display the outline of an icon, and wherein each of the second pixels includes a second reflective layer, a second emission layer, and a color filter.

The above display device further comprises a common electrode formed in all of the first pixels and the second pixels, wherein the first and second reflective layers are configured to function as a pixel electrode. The above display device further comprises a thin film encapsulation layer formed on the common electrode, wherein the color filter is formed on the thin film encapsulation layer. In the above display device, the first pixels and the second pixels are respectively configured on separate regions of the substrate to function as a main display and an auxiliary display, and wherein each of the first pixels has an icon shape in at least one of the main display and the auxiliary display. In the above display device, the auxiliary display is connected to one side of the main display and curved with a single curvature.

The above display device further comprises a first driver configured to drive the main display and a second driver configured to drive the auxiliary display, wherein the second driver is further configured to drive the auxiliary display while the main display is turned off. The above display device further comprises a driver configured to separately drive the main display and the auxiliary display, wherein the driver is further configured to display information on the auxiliary display while the main display is turned off. In the above display device, the main display is substantially flat, and wherein the auxiliary display is curved and adjacent to the main display. In the above display device, the auxiliary display is configured to display information while the main display is turned off. In the above display device, the size of the auxiliary display is less than that of the main display.

In the above display device, the size of the auxiliary display is less than a half, a third or a quarter of that of the main display. In the above display device, the main display includes a plurality of first color filters, wherein the auxiliary display includes a plurality of second color filters, and wherein the second color filters are thicker than the first color filters. In the above display device, the second color filters include a red filter, a green filter, and a blue filter, and wherein each of the red filter and the green filter is thicker than the blue filter. In the above display device, the thickness of the second color filters gradually increases as a function of distance from the main display.

Another aspect is a display device, comprising: a substrate including a flat portion and a curved portion; a main display including a plurality of first pixels and positioned at the flat portion of the substrate, wherein the main display is substantially flat, and wherein each of the first pixels includes a first reflective layer and a first emission layer and is configured to reflect external light so as to display the outline of an icon; an auxiliary display including a plurality of second pixels positioned at the curved portion of the substrate, wherein the auxiliary display is curved, and wherein each of the second pixels includes a second reflective layer, a second emission layer, and a color filter; and a driver configured to separately drive the main display and the auxiliary display.

In the above display device, the driver comprises a first driver configured to drive the main display and a second driver configured to drive the auxiliary display, and wherein the second driver is further configured to drive the auxiliary display while the main display is turned off. In the above display device, the driver is further configured to display information on the auxiliary display while the main display is turned off. In the above display device, the auxiliary display is configured to display the outline of at least one icon.

According to at least one of the disclosed embodiments, the display device may continuously display the outline of an icon in both a driving state and a non-driving state.

For example, in the non-driving state, visibility of the icon due to the external light may be implemented to be approximated to a printed matter under a bright room condition, and the icon may be displayed by using reflection of external light without power consumption. Further, the display device of the exemplary embodiment may improve light efficiency and image quality of the main display unit by changing a thickness of the color filter and improve outdoor visibility of the auxiliary display unit.

DETAILED DESCRIPTION OF CERTAIN INVENTIVE EMBODIMENTS

Figure 1:
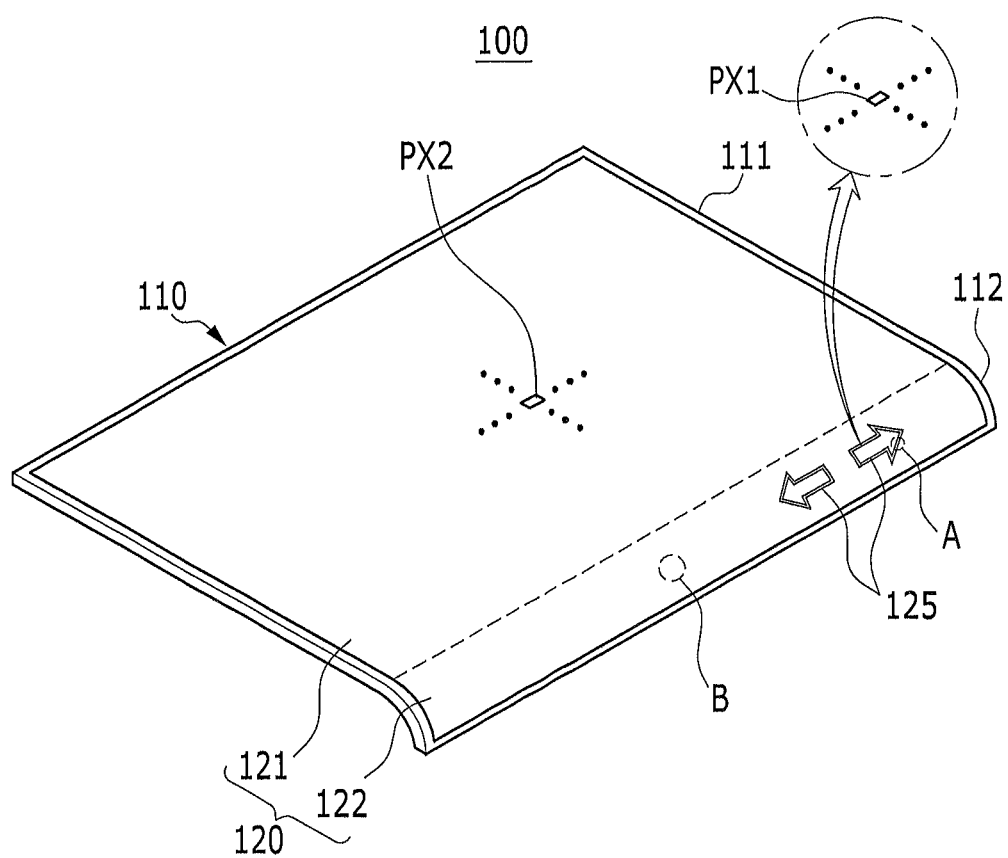
FIG. 1 is a perspective view of a display device according to a first exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

Throughout the specification and the claims, unless explicitly described to the contrary, the word "comprise" and variations such as "comprises" or "comprising" will be understood to imply the inclusion of stated elements but not the exclusion of any other elements. In addition, the size and thickness of each configuration shown in the drawings are arbitrarily shown for understanding and ease of description, but the present disclosure is not limited thereto. In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a perspective view of a display device 100 according to a first exemplary embodiment.

Referring to FIG. 1, the display device 100 includes a substrate 110 and a display unit 120 formed on the substrate 110. The substrate 110 may be a flexible substrate such as a plastic film. The display unit 120 includes a plurality of pixels PX1 and PX2 and displays a predetermined image in combination of lights emitted from the pixels PX1 and PX2.

The substrate 110 and at least a part of the display unit 120 may be curved with a predetermined curvature. For example, the substrate 110 may include a flat portion 111 and a curved portion 112, and the curved portion 112 may be connected to any one side of four sides of the flat portion 111. The curved portion 112 may be convex upwardly so that a center of curvature is positioned below the substrate 110, and the entire curved portion 112 may have a single curvature.

The display unit 120 may include a main display unit or a main display 121 positioned at the flat portion 111 and an auxiliary display unit or an auxiliary display 122 positioned at the curved portion 112. The main display unit 121 and the auxiliary display unit 122 are divided by regions according to flatness, and the display unit 120 may implement a single image with disconnection in the entire area. However, the main display unit 121 and the auxiliary display unit 122 can be controlled to be separately driven and only any one thereof may be driven according to a situation. The display device 100 can include a first driver configured to drive the main display unit 120 and a second driver configured to drive the auxiliary display unit 122. The display device 100 can also include a single driver configured to separately drive the main display unit 120 and the auxiliary display unit 122. The auxiliary display unit 122 is less than the main display unit 120. For example, the size of the auxiliary display unit 122 is less than a half, a third, or a quarter of that of the main display unit 120.

The display device 100 may be applied to mobile devices such as a smart phone, and a plurality of icons having functions such as a calling button, a text message button, a sound button, a menu key, and a cancel key may be displayed. At least one icon among the icons may be positioned at the auxiliary display unit 122 and display information by driving only the auxiliary display unit 122 while the main display unit 121 is turned off.

The display device 100 includes a plurality of first pixels PX1 and a plurality of second pixels PX2. The first pixels PX1 can be formed at predetermined icon shapes and can display the outline of icons by reflecting external light. The second pixels PX2 can include color filters to suppress reflection of external light. The display device 100 may display the outline of icons even in a non-driving state where power is not supplied to the display unit 120 in addition to a driving state by using the first pixels PX1.

In FIG. 1, reference numeral 125 illustrates an icon implemented by the first pixels PX1. The first pixels PX1 are positioned in at least one of the main display unit 121 and the auxiliary display unit 122. In FIG. 1, a case where the first pixels PX1 are formed by two arrow shapes in the auxiliary display unit 122 is illustrated as an example, but shapes, the number, and positions of icons 125 implemented by the first pixels PX1 are not limited to the illustrated example.

Figure 2:
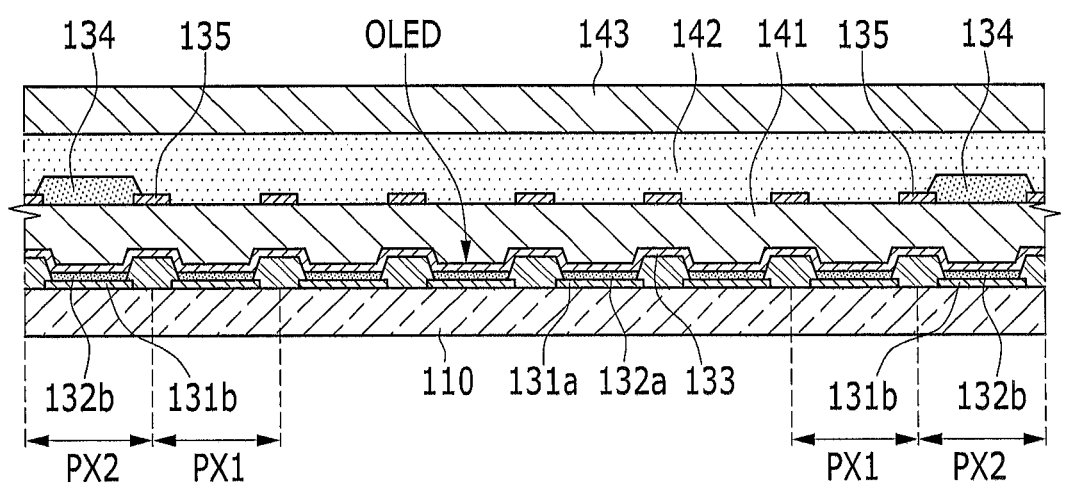
FIG. 2 is an enlarged cross-sectional view of a region A illustrated in FIG. 1.
Figure 3:
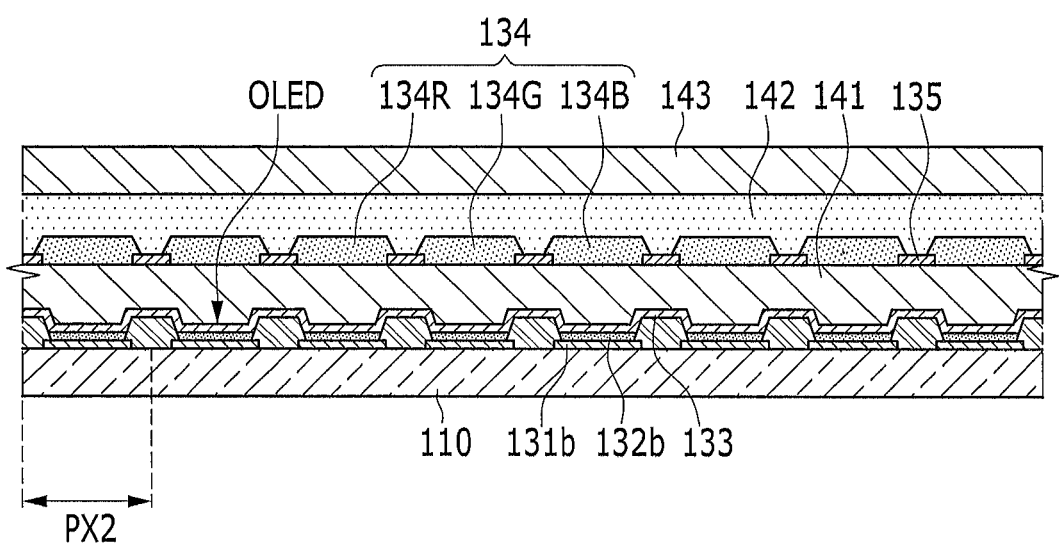
FIG. 3 is an enlarged cross-sectional view of a region B illustrated in FIG. 1.

The display device 100 may be an organic light-emitting diode (OLED) display. FIGS. 2 and 3 are enlarged cross-sectional views of a region A and a region B of the display device illustrated in FIG. 1, respectively. The region A and the region B are included in the curved portion 112 to actually have a predetermined curvature, but in FIGS. 2 and 3, for convenience, it is assumed and illustrated that the region A and the region B have a flat state. The region A is a region including the first pixels PX1, and the region B is a region including the second pixels PX2. The main display unit 121 has the same cross-sectional structure as the region B.

Referring to FIGS. 2 and 3, the first pixels PX1 and the second pixels PX2 are formed on the substrate 110. Each of the first pixels PX1 includes a first reflective layer 131*a* and a first emission layer 132*a*, and each of the second pixels PX2 includes a second reflective layer 131*b*, a second emission layer 132*b*, and a color filter 134. The configuration of the second pixel PX2 except for the color filter 134 is the same as the configuration of the first pixel PX1.

A common electrode 133 is formed in all of the first pixels PX1 and the second pixels PX2, and a thin film encapsulation or thin film encapsulation layer 141 may be formed on the common electrode 133. The color filter 134 may be formed directly on the thin film encapsulation 141, and an adhesive layer 142 and a touch screen panel 143 may be positioned on the color filter 134. The position of the color filter 134 is not limited to the aforementioned example.

Figure 4:
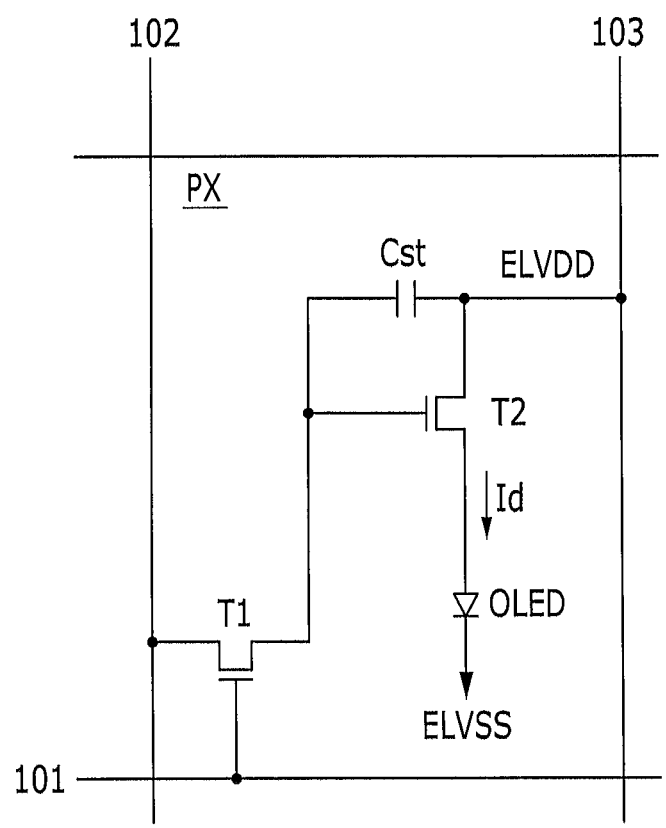
FIG. 4 is an equivalent circuit diagram of one pixel of the display device illustrated in FIG. 1.

Each of the first pixel PX1 and the second pixel PX2 includes a driving circuit (not illustrated) and an OLED of which emission is controlled by the driving circuit. FIG. 4 is an equivalent circuit diagram of one pixel, and FIG. 5 is an enlarged cross-sectional view illustrating a driving circuit and a part of an OLED.

Figure 5:
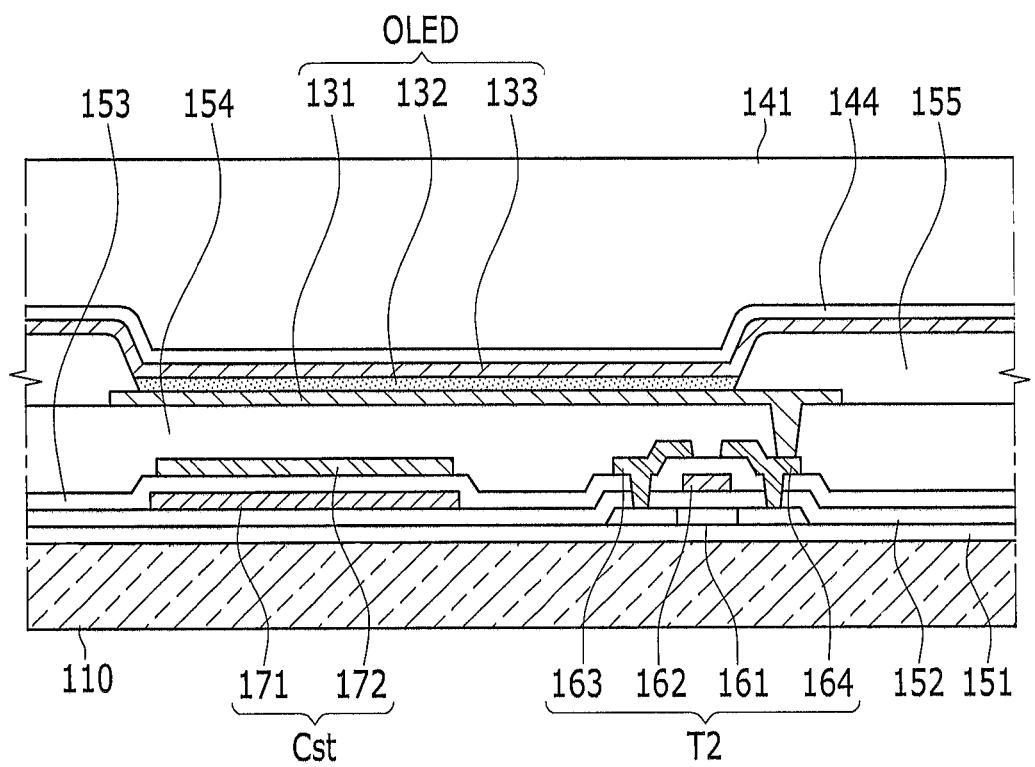
FIG. 5 is an enlarged cross-sectional view illustrating a driving circuit and a part of an organic light-emitting diode of the display device illustrated in FIG. 1.

Referring to FIGS. 4 and 5, on the substrate 110, a plurality of signal lines and a plurality of pixels PX which are connected to the signal lines and arranged substantially in a matrix form are formed. The signal lines include a scan line 101 transferring a scan signal, a data line 102 transferring a data signal, and a driving voltage line 103 transferring a driving voltage ELVDD. The driving circuit includes a switching thin film transistor T1, a driving thin film transistor T2, and a storage capacitor Cst.

The switching thin film transistor T1 includes a control terminal, an input terminal, and an output terminal. The control terminal is connected to the scan line 101, the input terminal is connected to the data line 102, and the output terminal is connected to the driving thin film transistor T2. The switching thin film transistor T1 transfers the data signal received from the data line 102 to the driving thin film transistor T2 in response to the scan signal received from the scan line 101.

The driving thin film transistor T2 also includes a control terminal, an input terminal, and an output terminal. The control terminal is connected to the switching thin film transistor T1, the input terminal is connected to the driving voltage line 103, and the output terminal is connected to the OLED. The driving thin film transistor T2 runs an output current Id of which an amplitude varies according to a voltage applied between the control terminal and the input terminal.

The storage capacitor Cst is connected between the control terminal and the input terminal of the driving thin film transistor T2. The storage capacitor Cst charges the data signal applied to the control terminal of the driving thin film transistor T2 and maintains the charged data signal even after the switching thin film transistor T1 is turned off.

The OLED includes a pixel electrode 131 connected to the output terminal of the driving thin film transistor T2, a common electrode 133 connected to a common voltage ELVSS, and an emission layer 131 positioned between the pixel electrode 132 and the common electrode 133. The OLED emits light by varying an intensity according to an output current Id of the driving thin film transistor T2.

The pixel configuration of the display device 100 is not limited to the aforementioned example, and if necessary, a separate thin film transistor and a separate capacitor may be added. Hereinafter, a cross-sectional structure of the pixel will be described. In FIG. 5, for convenience, the switching thin film transistor is omitted.

A buffer layer 151 is formed on the substrate 110. The buffer layer 151 may be formed by a single layer of silicon nitride (SiNx) or a double layer of silicon nitride (SiNx) and silicon oxide ($SiO_2$). The buffer layer 151 serves to prevent impurities from permeating through the substrate 110 and planarize the surface.

A semiconductor layer 161 is formed on the buffer layer 151. The semiconductor layer 161 may be formed of poly-silicon or an oxide semiconductor, and the semiconductor layer 161 formed of the oxide semiconductor may be covered by a separate passivation layer. The semiconductor layer 161 includes a channel region in which impurities are not doped, and a source region and a drain region in which the impurities are doped.

A gate insulating layer 152 is formed on the semiconductor layer 161. The gate insulating layer 152 may be formed of a single layer of silicon nitride (SiNx) or silicon oxide ($SiO_2$) or a laminated layer of silicon nitride (SiNx) and silicon oxide ($SiO_2$). A gate electrode 162 and a first capacitor plate 171 are formed on the gate insulating layer 152. The gate electrode 162 overlaps with the channel region of the semiconductor layer 161 and may include Au, Ag, Cu, Ni, Pt, Pd, Al, Mo, and the like.

An interlayer insulating layer 153 is formed on the gate electrode 162 and the first capacitor plate 171. The interlayer insulating layer 153 may be formed of a single layer of silicon nitride (SiNx) or silicon oxide ($SiO_2$) or a laminated layer of silicon nitride (SiNx) and silicon oxide ($SiO_2$). A source electrode 163, a drain electrode 164, and a second capacitor plate 172 are formed on the interlayer insulating layer 153.

The source electrode 163 and the drain electrode 164 are connected with the source region and the drain region of the semiconductor layer 161 through a via hole formed in the interlayer insulating layer 153 and the gate insulating layer 152, respectively. The source electrode 163 and the drain electrode 164 may be formed by a metal multilayer such as Mo/Al/Mo or Ti/Al/Ti. The second capacitor plate 172 overlaps with the first capacitor plate 171, and the first and second capacitor plates 171 and 172 form the storage capacitor Cst which uses the interlayer insulating layer 153 as a dielectric material.

In FIG. 5, a top gate type driving thin film transistor T2 is illustrated as an example, but a structure of the driving thin film transistor T2 is not limited to the illustrated example. The driving thin film transistor T2 is covered by a planarization layer 154 and connected to the OLED to drive the OLED. The planarization layer 154 may be formed of a single layer of an inorganic insulating material or an organic insulating material or a laminated layer of the inorganic insulating material and the organic insulating material.

A pixel electrode 131 is formed on the planarization layer 154. The pixel electrode 131 is formed one by one for each pixel and connected with the drain electrode 164 of the driving thin film transistor T2 through the via hole formed in the planarization layer 154. A pixel defining layer 155 is formed on the planarization layer 154 and an edge of the pixel electrode 131. The pixel defining layer 155 may include a polyacrylate or polyimide-based resin, a silica-based inorganic material, and the like.

The emission layer 132 is formed on the pixel electrode 131, and the common electrode 133 is formed on the emission layer 132 and the pixel defining layer 155. The common electrode 133 is formed in the entire display unit 120 without dividing the pixels. Any one of the pixel electrode 131 and the common electrode 133 injects a hole to the emission layer 132, and the other electrode injects an electron to the emission layer 132. The electron and the hole are coupled with each other in the emission layer 132 to generate an exciton, and light is emitted by energy generated when the exciton falls from an excited state to a ground state.

The emission layer 132 includes an organic emission layer, and includes at least one of a hole injection layer, a hole transport layer, an electron transport layer, and an electron injection layer. When the pixel electrode 131 is an anode injecting a hole, the hole injection layer, the hole transport layer, the organic emission layer, the electron transport layer, and the electron injection layer may be sequentially laminated on the pixel electrode 131. Other layers except for the organic emission layer may be formed in the entire display unit 120.

The pixel electrode 131 is formed by a reflective film, and the common electrode 133 is formed by a transparent film or a translucent film. Accordingly, the light emitted from the emission layer 132 is reflected from the pixel electrode 131 and passes through the common electrode 133 to be emitted to the outside.

The reflective film may include Au, Ag, Mg, Al, Pt, Pd, Ni, Nd, Ir, Cr, or the like. The transparent film may include indium tin oxide (ITO), indium zinc oxide (IZO), ZnO, $In_2O_3$, or the like. The translucent film may be formed by a metal thin film including Li, Ca, LiF/Ca, LiF/Al, Al, Ag, Mg, or the like, and a transparent film such as ITO, IZO, ZnO, $In_2O_3$, or the like may be formed on the translucent film.

A capping layer 144 may be formed on the common electrode 133. The capping layer 144 serves to optimize light efficiency by matching a refractive index and may include an organic material such as tris(8-hydroxyquinoline) aluminum (Alq3) or copper phthalocyanine (CuPc).

Referring back to FIGS. 2 and 3, the first reflective layer 131a and the first emission layer 132a of the first pixel PX1 correspond to the pixel electrode 131 and the emission layer 132 of the aforementioned OLED, respectively. The second reflective layer 131b and the second emission layer 132b of the second pixel PX2 also correspond to the pixel electrode 131 and the emission layer 132 of the aforementioned OLED.

The thin film encapsulation 141 is configured by a laminated structure of an inorganic layer and an organic layer and seals the OLED to prevent external air from permeating. The thin film encapsulation 141 basically includes a first inorganic layer, a first organic layer, and a second inorganic layer, and may further include additional organic layer and inorganic layer.

The first pixels PX1 and the second pixels PX2 include a red OLED having a red emission layer, a green OLED having a green emission layer, and a blue OLED having a blue emission layer, and if necessary, may further include a white OLED having a white emission layer. On the other hand, all of the first pixels PX1 and the second pixels PX2 may include a white OLED having a white emission layer.

The color filter 134 is included in each of the second pixels PX2. That is, the first pixels PX1 do not include the color filter. The color filters 134 include a red filter 134R, a green filter 134G, and a blue filter 134B and are formed on the OLEDs having the same color. In the case where the second pixels PX2 includes the white OLED, the color filter 134 converts white light of the OLED into red light, green light, or blue light to display a color.

Each of the red filter 134R, the green filter 134G, and the blue filter 134B absorbs other color components except for its own specific color of external light incident to the display device 100. Visible light has a wavelength of approximately 380 nm to 780 nm, and in the visible light, a wavelength of red light is approximately 620 nm to 780 nm, a wavelength of green light is approximately 490 nm to 570 nm, and a wavelength of blue light is approximately 450 nm to 490 nm. The color filter 134 absorbs light having other wavelength bands except for a wavelength having its own specific color in the incident visible light to reduce reflection of external light.

In FIGS. 2 and 3, reference numeral 135 illustrates a black layer formed between the color filters 134. The black layer 135 serves to reduce reflection of external light and increase a contrast of a screen. The black layer 135 is formed in the entire display unit 120, or may be formed only in the second pixels PX2 region with the color filter 134. In FIG. 2, the case where the black layer 135 is formed in the entire display unit 120 is illustrated as an example.

Referring to FIGS. 1 to 3, the first pixels PX1 arranged in icon shapes does not include the color filters, and as a result, most of the external light incident to the first pixels PX1 is reflected. That is, external light incident to the first pixels PX1 is reflected by the first reflective layer 131a, and a user may recognize the reflected external light as the icon shape.

Accordingly, the display device 100 of the first exemplary embodiment may display the outline of icons 125 at all times in both the driving state and the non-driving state. In the non-driving state of the display unit 120, reflectance of external light in a region where the first pixels PX1 is formed is approximately 50% and may implement image quality of a reflective e-book level or more. In the driving state of the display unit 120, brightness of the icon 125 may be increased by emitting light of the first pixels PX1.

When the first pixels PX1 include all of the red organic light-emitting diode, the green OLED, and the blue OLED or all of the first pixels PX1 include the white OLED, the color of the icon 125 recognized by the user may be white.

In the non-driving state, visibility of the icon 125 due to the external light may be implemented to be approximated to a printed matter under a bright room condition.

Assuming a display device of a Comparative Example in which the entire display unit 120 is configured by only the second pixels PX2, the display device of the Comparative Example needs to continuously drive at least a part of the display unit, for example, the auxiliary display unit in order to display the outline of the icon. However, in this case, power consumption is large. The display device 110 of the first exemplary embodiment may display the outline of the icon 125 at all times by using reflection of external light without power consumption.

The first pixels PX1 is not limited to the auxiliary display unit 122 and formed even in the main display unit 121 to display the outline of the icon such as the menu key or the cancel key.

Figure 6:
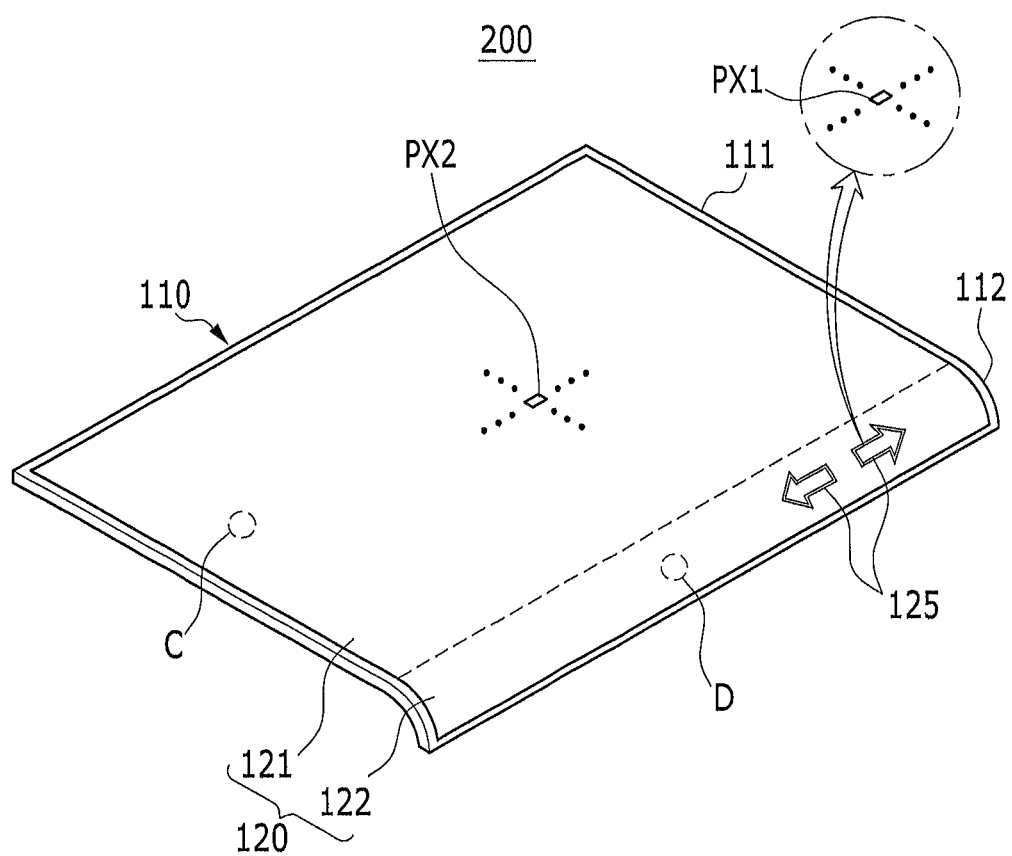
FIG. 6 is a perspective view of a display device according to a second exemplary embodiment.
Figure 7:
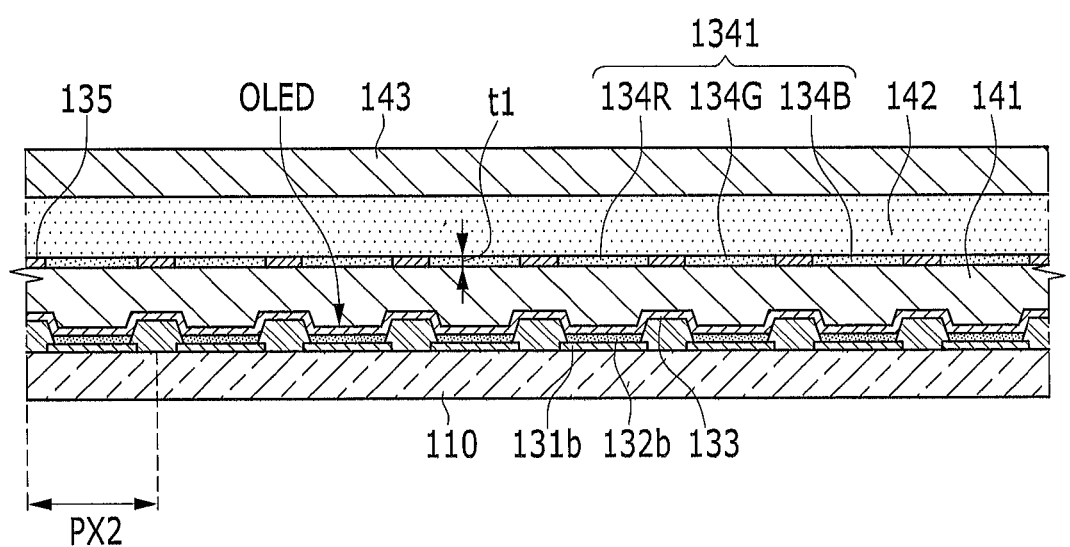
FIG. 7 is an enlarged cross-sectional view of a region C of the display device illustrated in FIG. 6.
Figure 8:
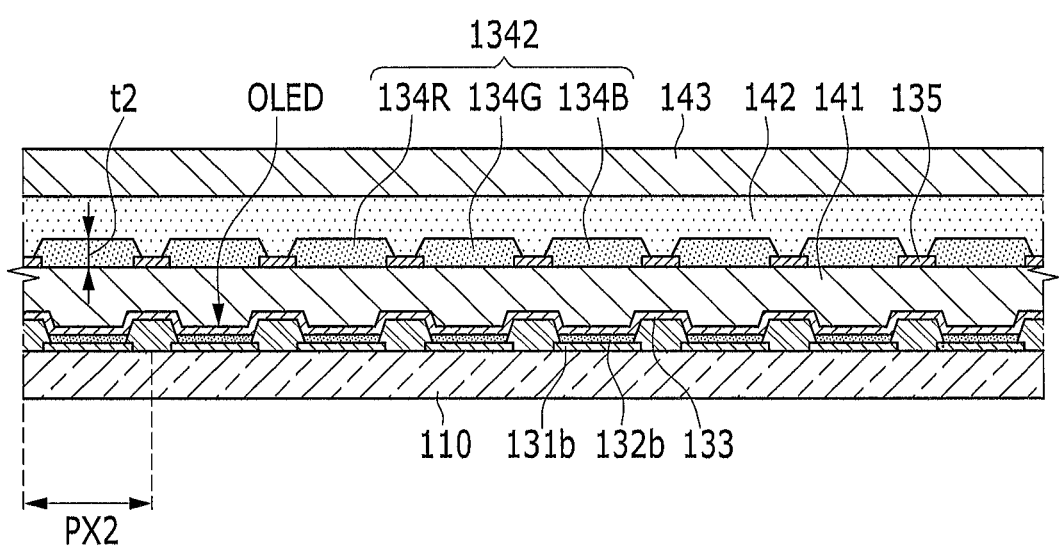
FIG. 8 is an enlarged cross-sectional view of a region D of the display device illustrated in FIG. 6.

FIG. 6 is a perspective view of a display device 200 according to a second exemplary embodiment, and FIGS. 7 and 8 are enlarged cross-sectional views of a region C and a region D illustrated in FIG. 6, respectively. The region D is included in the curved portion 112 to actually have a predetermined curvature, but in FIG. 8, for convenience, it is assumed and illustrated that the region D has a flat state. The region C is included in the main display unit 121, and the region D is included in the auxiliary display unit 122.

Referring to FIGS. 6 to 8, color filters 1341 and 1342 include a first color filter 1341 positioned in the main display unit 121 and a second color filter 1342 positioned in the auxiliary display unit 122. A thickness of the second color filter 1342 is larger than a thickness of the first color filter 1341.

The first color filter 1341 includes a red filter 134R, a green filter 134G, and a blue filter 134B which are formed with a thickness of t1. The second color filter 1342 includes a red filter 134R, a green filter 134G, and a blue filter 134B which are formed with a thickness of t2 larger than t1.

The display device 200 may display various icons and information such as a text message by driving only the auxiliary display unit 122. In this case, the main display unit 121 is mainly used in the shade or indoors which is not subject to sunlight, and the auxiliary display unit 122 is more frequently used in the outdoors rather than the main display unit 121.

The color filters 1341 and 1342 absorb a part of light emitted from the OLED in addition to the ambient or external light. Since the main display unit 121 is mainly used in a low illuminance environment, transmittance of the light emitted from the OLED is increased by reducing the thickness of the first color filter 1341. Since the auxiliary display unit 122 is mainly used in a high illuminance environment, absorptance of external light is increased by increasing the thickness of the second color filter 1342.

Accordingly, the display device 200 may improve light efficiency and image quality of the main display unit 121 and improve outdoor visibility of the auxiliary display unit 122. In the display device 200 of the second exemplary embodiment, the remaining configurations except for the thickness of the color filters 1341 and 1342 are the same as those of the aforementioned first exemplary embodiment.

Figure 9:
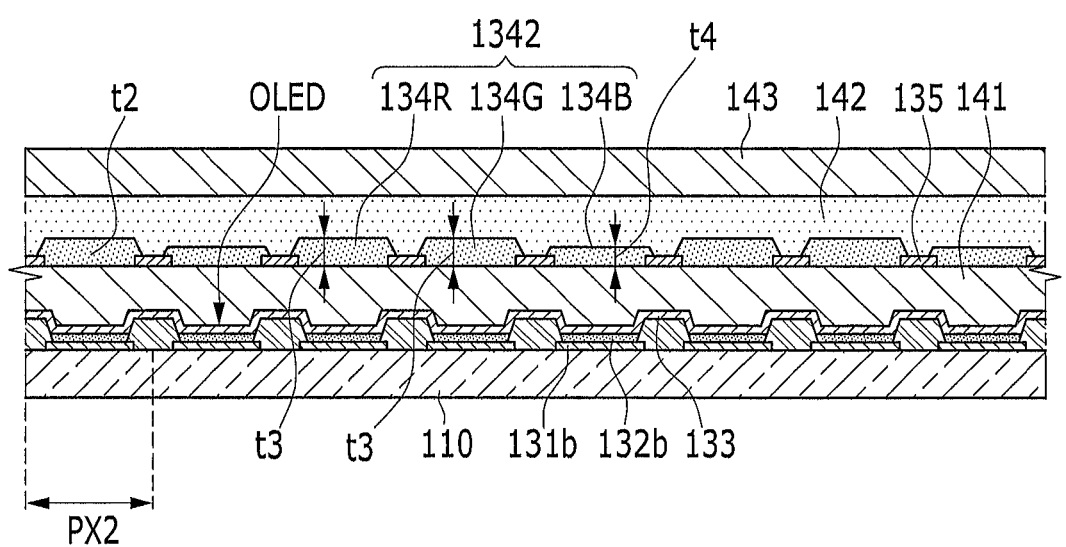
FIG. 9 is an enlarged cross-sectional view of an auxiliary display unit of a display device according to a third exemplary embodiment.

FIG. 9 is an enlarged view of an auxiliary display unit of a display device according to a third exemplary embodiment. The auxiliary display unit 122 is included in the curved portion 112 to actually have a predetermined curvature, but in FIG. 9, for convenience, it is assumed and illustrated that the auxiliary display unit 122 has a flat state.

Referring to FIG. 9, in a display device of the third exemplary embodiment, the second color filter 1342 includes a red filter 134R, a green filter 134G, and a blue filter 134B, and a thickness t3 of the red filter 134R and the green filter 134G is larger than a thickness t4 of the blue filter 134B. The red filter 134R and the green filter 134G may be formed with the same thickness.

Since the auxiliary display unit 122 is mainly used outdoors, the reflection of external light needs to be actively decreased. Since outdoor light mainly has a long wavelength to which red and green belong rather than a short wavelength to which blue belongs, absorptance of the long wavelength is increased by increasing the thickness of the red filter 134R and the green filter 134G which belong to the long wavelength. Accordingly, the display device of the third exemplary embodiment may further improve outdoor visibility of the auxiliary display unit 122.

Meanwhile, blue perception of the human eye is lower than red and green perception. The display device of the third exemplary embodiment increases transmittance of blue light emitted from the corresponding organic light-emitting diode OLED by decreasing the thickness of the blue filter 134B to enhance efficiency of the blue light. In the display device of the third exemplary embodiment, the remaining configurations except for the thickness difference of the second color filter 1342 are the same as those of the aforementioned second exemplary embodiment.

Figure 10:
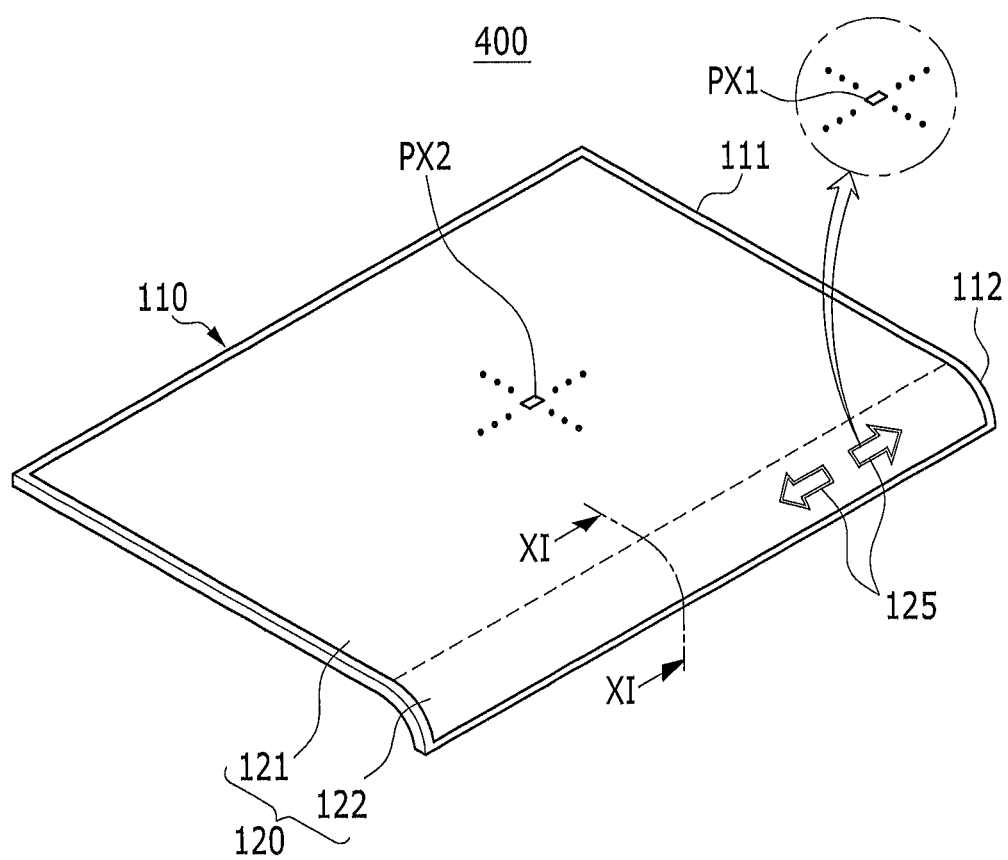
FIG. 10 is a perspective view of a display device according to a fourth exemplary embodiment.
Figure 11:
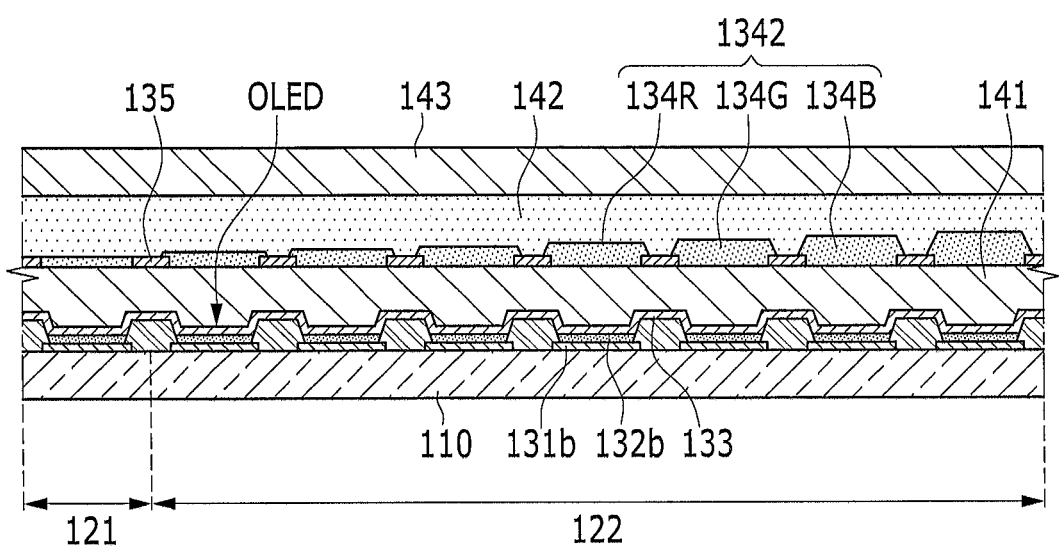
FIG. 11 is an enlarged cross-sectional view of the display device of FIG. 10 taken along line XI-XI.

FIG. 10 is a perspective view of a display device 400 according to a fourth exemplary embodiment, and FIG. 11 is an enlarged cross-sectional view of the display device of FIG. 10 taken along line XI-XI. The auxiliary display unit 122 illustrated in FIG. 11 is included in the curved portion 112 to actually have a predetermined curvature, but in FIG. 11, for convenience, it is assumed and illustrated that the auxiliary display unit 122 has a flat state.

Referring to FIGS. 10 and 11, in the display device 400, the second color filter 1342 is formed with a thickness which is gradually increased further from the main display unit 121. Accordingly, outdoor visibility may be further improved at the outside of the auxiliary display unit 122 which is far away from the main display unit 121. In the display device 400 of the fourth exemplary embodiment, the remaining configurations except for the thickness difference of the second color filter 1342 are the same as those of the aforementioned second exemplary embodiment.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a substrate;
   a plurality of first pixels disposed on the substrate, wherein each of the first pixels includes a first reflective layer and a first emission layer;
   a plurality of second pixels disposed on the substrate;
   a common electrode disposed in all of the first pixels and the second pixels; and
   a thin film encapsulation layer disposed on the common electrode,
   wherein each of the second pixels includes a second reflective layer, a second emission layer, and a color filter, wherein the first pixels are arranged in an icon shape and each of the first pixels does not include a color filter, wherein the first reflective layer is configured to reflect external light when power is not supplied to the first pixels, wherein the first pixels display an icon shape image when power is not supplied to the first pixels, wherein the color filter is disposed on the thin film encapsulation layer in each of the second pixels, and wherein an adhesive layer covers an upper surface of the thin film encapsulation layer facing away from the substrate in each of the first pixels not including a color filter, and wherein the adhesive layer is in direct contact with upper and side surfaces of the color filter, wherein the thin film encapsulation layer is in direct contact with the adhesive layer in the first pixel, and wherein the adhesive layer is configured to secure a touch screen panel to a top surface of the adhesive layer.

2. The display device of claim 1, wherein the first and second reflective layers are configured to function as a pixel electrode.

3. The display device of claim 1, wherein the first pixels and the second pixels are respectively configured on separate regions of the substrate to function as a main display unit and an auxiliary display unit, and wherein each of the first pixels is disposed in the auxiliary display unit.

4. The display device of claim 3, wherein the auxiliary display unit is connected to one side of the main display unit and curved with a single curvature.

5. The display device of claim 3, further comprising a first driver configured to drive the main display writ and a second driver configured to drive the auxiliary display unit, wherein the second driver is further configured to drive the auxiliary display unit while the main display unit is turned off.

6. The display device of claim 3, further comprising, a driver configured to separately drive the main display unit and the auxiliary display unit, wherein the driver is further configured to display information on the auxiliary display unit, while the main display unit is turned off.

7. The display device of claim 3, wherein the main display unit is substantially flat, and wherein the auxiliary display unit is curved and adjacent to the main display unit.

8. The display device of claim 3, wherein the auxiliary display unit is configured to display information while the main display unit is turned off.

9. The display device of claim 3, wherein the size of the auxiliary display unit is less than that of the main display unit.

10. The display device of claim 9, wherein the size of the auxiliary display unit is less than a half a third or a quarter of that of the main display unit.

11. The display device of claim 1, wherein the first pixels do not overlap the color filters of the second pixels in the depth dimension of the display device.

12. The display device of claim 1, wherein the adhesive layer fills a space between the upper surface of the thin film encapsulation layer and a touch screen panel disposed on the adhesive layer in each of the first pixels not including a color filter.

13. The display device of claim 12, further comprising a black layer disposed between the color filter in each of the second pixels and die adhesive layer disposed on the upper surface of the thin film encapsulation layer in each of the first pixels not including a color filter.

14. The display device of claim 1, wherein the thin film encapsulation layer includes an organic layer and an inorganic layer.

15. A display device, comprising:
a substrate including a flat portion and a curved portion;
a main display unit including a plurality of second pixels and positioned at the flat portion of the substrate, wherein the main display unit is substantially flat, wherein each of the second pixels includes a second reflective layer and a second emission layer, and a color filter disposed directly on a thin film encapsulation layer, wherein the thin film encapsulation layer is positioned between the second emission layer and the color filter;
an adhesive layer that covers an upper surface of the thin film encapsulation layer and is in direct contact with upper and side surfaces of the color filter;
an auxiliary display unit including a plurality of first pixels positioned at the curved portion of the substrate, wherein the auxiliary display unit is curved, wherein each of the first pixels includes a first reflective layer, a first emission layer, and wherein the first reflective layer is configured to reflect external light when power is not supplied to the first pixels; and
wherein the first pixels display an icon shape image when power is not supplied to the first pixels,
a driver configured to separately drive the main display unit and the auxiliary display unit,
wherein the first pixels are arranged in an icon shape and each of the first pixels does not include a color filter, and
wherein the adhesive layer is configured to secure a touch screen panel to a top surface of the adhesive layer.

16. The display device of claim 15, wherein the driver comprises a second driver configured to drive the main display unit and a first driver configured to drive the auxiliary display unit, and wherein the first driver is further configured to drive the auxiliary display unit while the main display unit is turned off.

17. The display device of claim 15, wherein the driver is further configured to display information on the auxiliary display unit while the main display unit is turned off.

18. The display device of claim 15, wherein the auxiliary display unit is configured to display the outline of the icon.

19. The display device of claim 18, wherein the icon comprises at least one of the following: a calling button, a text message button, a sound button, a menu key, and a cancel key.

20. The display device of claim 15, wherein the size of the auxiliary display unit is less than that of the main display unit.

* * * * *